United States Patent [19]

Nakaso et al.

[11] Patent Number: 4,643,793

[45] Date of Patent: Feb. 17, 1987

[54] PROCESS FOR TREATING METAL SURFACE

[75] Inventors: Akishi Nakaso, Oyama; Youichi Kaneko, Shimodate; Toshiro Okamura, Shimodate; Kiyoshi Yamanoi, Shimodate, all of Japan

[73] Assignee: Hitachi Chemical Company, Ltd., Tokyo, Japan

[21] Appl. No.: 750,780

[22] Filed: Jul. 1, 1985

[30] Foreign Application Priority Data

Jun. 29, 1984 [JP] Japan .................................. 59-135561
Jun. 29, 1984 [JP] Japan .................................. 59-135562
Jan. 30, 1985 [JP] Japan .................................... 60-15807

[51] Int. Cl.$^4$ ................................................. H05K 3/46
[52] U.S. Cl. ................................ 156/306.6; 106/1.23; 427/98; 427/437; 427/409; 428/901
[58] Field of Search ................ 106/1.23; 427/437, 98, 427/409; 156/306.6; 428/901

[56] References Cited

U.S. PATENT DOCUMENTS

| | | | |
|---|---|---|---|
| 4,301,196 | 11/1981 | McCormick | 427/443.1 |
| 4,313,995 | 2/1982 | Delgadillo | 428/901 |
| 4,388,136 | 6/1983 | Huie | 428/901 |
| 4,548,644 | 10/1985 | Nakaso | 106/1.23 |

Primary Examiner—John D. Smith
Attorney, Agent, or Firm—Antonelli, Terry & Wands

[57] ABSTRACT

A process for treating a surface of a metal such as copper with a liquid composition comprising (I) copper ions, a complexing agent, a reducing agent, a pH adjusting agent, water, and (II) a nitrogen-containing organic compound such as heterocyclic compound or containing —N= and —NH$_2$ and/or —OH groups in its molecule can give multilayer printed wiring boards having excellent adhesive strength and line definition of inner layer copper conductors with long shelf life.

10 Claims, 1 Drawing Figure

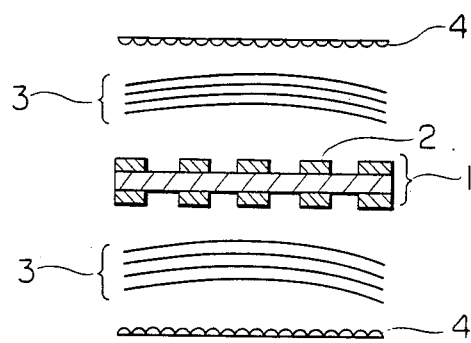

4,643,793

PROCESS FOR TREATING METAL SURFACE

BACKGROUND OF THE INVENTION

This invention relates to a process for treating surfaces of metal such as copper, said metal being subjected to a pre-treatment of copper conductor of wiring boards for inner layers which are bonded via prepregs in the production of multilayer printed wiring boards.

Multilayer printed wiring boards are usually produced by the following processes:

(1) One process comprises forming printed copper conductors by etching of copper foils of copper clad laminates to give printed wiring boards for inner layers, treating surfaces of copper conductors with a chemical solution of ammonium persulfate, cupric chloride, copper acetate, or the like for roughening, laminating and adhering copper clad laminates for outer layers via prepregs (products of impregnating base materials such as paper and glass fabrics with thermosetting resins, followed by drying them) on one or more thus treated inner layer printed wiring boards, drilling or punching through holes at predetermined portions including the copper conductors of inner layers, immersing in a sensitizing solution, forming electroless copper plated layers on walls of the through holes, and etching the copper foils for outer layers in accordance with the inner copper conductors pattern to form outer layer copper conductors.

(2) Another process comprises subjecting one or more copper clad laminates having both-side roughened copper foils for improving adhesiveness and the like (both-side roughened copper foils) to the same treatment as in the process (1) to give printed wiring boards for inner layers, omitting the surface roughening step, laminating and adhering copper clad laminates for outer layers via prepregs on one or more thus treated inner layer printed wiring boards, followed by the same procedures as described in the process (1) to give a multilayer printed wiring board.

(3) A further process comprises forming printed wiring boards for inner layers in the same manner as described in the process (1), roughening copper conductor surfaces in the same manner as described in the process (1), treating with a sodium chlorite-sodium hydroxide-trisodium phosphate treating solution, forming copper oxide films (1–3 μm) on the roughened copper conductor surfaces, laminating and adhering copper clad laminates for outer layers via prepregs on one or more thus treated inner layer printed circuit boards, followed by the same procedures as described in the process (1) to give a multilayer printed wiring board.

But these processes have following disadvantages.

The multilayer printed wiring board produced by the process (1) is insufficient in adhesive strength between an inner layer copper conductor and a resin layer obtained by curing the prepseg. Further in the step of mounting various electronic devices on the produced multilayer printed wiring board with solder, there take place peeling between an inner layer copper conductors and a resin layer obtained by curing the prepreg, and sometimes blisters derived from the peeling which can be identified by the naked eye from outside.

In the process (2), since the both-side roughened copper foil is used, a roughened surface is sometimes scratched in the steps until the formation of printed wirings on the copper clad laminates. In such a case, the scratched portion is lowered in adhesive strength. Further, since the roughened surface of copper foil is used, pattern definition of printing etching resist or pattern definition of etching resist in a UV photographic printing method used for forming printed wiring patterns is poor.

In the process (3), the copper oxide film is dissolved by the sensitizing solution used in the step of providing a plating catalyst on through hole surfaces for forming electroless copper plated films thereon (the sensitizing solution being an acidic solution of pH 4 or less) or by an acidic solution used in the step for removing a smear adhered to a cut surface of inner layer copper conductors after drilling through holes and the acidic solution permeates between inner layer copper conductor surfaces and resin layers to bring about a pink-ring phenomenon and to lower the adhesiveness between an inner layer copper conductor surface and a resin layer obtained by curing the prepreg and insulation resistance between conductors.

SUMMARY OF THE INVENTION

It is an object of this invention to provide a process for treating surfaces of a metal such as copper improved in adhesive strength to a resin material such as a prepreg used in the production of multilayer printed wiring boards, etc.

This invention provides a process for treating a surface of a metal with a liquid composition (a treating solution A) comprising.

(I) copper ions, a complexing agent for copper ions, a reducing agent for copper ions, a pH adjusting agent, water, and (II) a nitrogen-containing organic compound capable of forming an electroless deposition of copper having a color and gloss other than those of metallic copper by the addition to (I).

BRIEF DESCRIPTION OF THE DRAWING

The attached drawing is a cross-sectional view showing arrangement of materials for producing a multilayer printed wiring board.

DESCRIPTION OF THE PREFERRED EMBODIMENTS

The treating solution A comprises (I) copper ions, a complexing agent for copper ions, a reducing agent for copper ions, a pH adjusting agent, water, and (II) a nitrogen-containing organic compound capable of forming electroless deposition of copper having a color and gloss other than those of metallic copper by the addition to the component (I).

As the copper ions, there can be used those obtained from a copper ion source such as copper sulfate, copper nitrate, cupric chloride, and the like conventional copper salts.

As the complexing agent for copper ions, there can be used compounds which form complexes with the above-mentioned copper ions and make the complexes soluble in an aqueous alkaline solution. Examples of the complexing agents are ethylenediaminetatraacetic acid (EDTA) or sodium salts (mono-, di-, tri- or tetrasodium) thereof, N,N,N',N'-tetrakis(2-hydroxy-propyl)ethylenediamine, nitrilotriacetic acid and its alkali salts, gluconic acid, gluconates, triethanolamine, tartaric acid, etc.

As the reducing agent for copper ions, there can be used formaldehyde, and formaldehyde precursors or derivatives, such as paraformaldehyde, hypophosphites, etc.

As the pH adjusting agent for adjusting the pH of the treating solution A, there can be used sodium hydroxide, potassium hydroxide, etc.

As the water, the use of deionized water is preferable.

Preferable composition of the component (I) are as follows:

| | |
|---|---|
| copper ions | 0.004–0.1 mole/liter |
| complexing agent | 0.004–0.2 mole/liter |
| reducing agent | 0.01–0.25 mole/liter |
| pH | 11.0–13.4 |

A concrete example of the component (I) is as follows:

| | |
|---|---|
| $CuSO_4.5H_2O$ | 2–20 g/liter |
| ethylenediaminetetraacetic acid: $[CH_2N(CH_2COOH)_2]_2$ | 1–5 moles/mole of $CuSO_4$ |
| 37% formalin: | 2–20 ml/liter |
| pH: | 11.0–13.5 |

As the nitrogen-containing organic compound of the component (II), there can be use nitrogen-containing heterocylic compounds and organic compounds containing —N= and —NH and/or —OH groups in one molecule, alone or as a mixture thereof.

Examples of the nitrogen-containing heterocyclic compounds are 2,4,6-tris(2-pyridyl)-s-triazine, $\alpha,\alpha',\alpha''$-tripyridyl, 1,10-phenanthroline, 4,7-diphenyl-1,10-phenanthroline, 4,7-dimethyl-1,10-phenanthroline, 4,7-diphenyl-1,10-phenanthroline disulfonic acid disodium salt, 3-(2-pyridyl)-5,6-diphenyl-1,2,4-triazine, $\alpha,\alpha'$-dipyridyl, Phthalocyanine Green, 2,4-dimethylimidazoline, etc.

Examples of organic compounds containing —N= and —NH₂ and/or —OH groups in one molecule are 8-azaguanine, xanthopterin, 5-aminoindazole, 2-aminoperimidine.hydrochloride, 2-aminoperimidine.-hydrobromide, benzoguanamine, acriflavine.hydrochloride, 5-amino-1H-tetrazole, 6-amino-2-phenyl-4-quinolinol, 2-amino-6,8-dihydroxypurine, 2-aminopyrimidine, 6-hydroxy-2,4,5-triaminopyrimidine.-sulfate, 2,4-diamino-6-hydroxypyrimidine, 2-amino-4-hydroxy-6-methylpyrimidine, 4,6,-dihydroxypyrimidine, nitroguanidine, 1-hydroxy-1H-benzotriazole.-monohydrate, 2-hydroxybenzimidazole, 2-amino-3-hydroxypyridine, etc.

It is also possible to use other nitrogen-containing compounds not mentioned above so long as they are capable of forming electroless copper deposition having a color and gloss other than those of metallic copper on a surface of a metal such as copper by the addition to the component (I).

The adding amount of the component (II) is usually 0.1 mg/liter or more. Since these compounds mentioned above are relatively expensive, the addition in a too large amount is not preferable from the viwpoint of production cost. It is preferable to use in the range of 1 to 500 mg/liter. These compounds of the component (II) are available commercially from Dojindo Laboratories Co., Ltd., Tokyo Kasei Kogyo Co., Ltd., Aldrich Chemical Co. in U.S.A, etc.

The treating solution A is fundamentally belongs to an electroless copper deposition bath used for forming conductors on insulating substrates in the production of printed wiring boards. But the electroless copper deposition bath conventionally used is so composed as to from an electroless copper deposition having a metallic copper color and metallic copper gloss on the insulating substrates by adding various additives to the component (I). In contrast, in the present invention, the component (II) is added to the component (I) so as to form an electroless copper deposition having a color and gloss other than those of metallic copper obtained by the conventionally used electroless copper deposition bath on a surface of metal such as copper.

By the treatment with the treating solution A, there can be formed an electroless copper deposition layer having minute particles, needles, cylinders, or as a mixture therof in the layer as deposited surface morphology. Such an electroless copper deposition layer is colored in a dark color such as dark brown, grayish brown, bluish violet, bluish black, brownish black, etc, with no gloss. Such a color has an average absorption rate of 0.5 or more, preferably 0.7 or more, using a light of 300 to 800 nm and converted to values so as to meet the wavelength intensity distribution of the sun light.

The temperature of the treating solution A depends mainly on the pH and the concentration of reducing agent of the treating solution A. When the pH or the reducing agent concentration is high, the treatment becomes possible even at low temperatures. Therefore, it is possible to select the temperature from room temperature to about 90° C. depending on the composition of the treating solution A.

The treating time has a relation with the deposition rate of the treating solution A. Since a shorter treating time is preferable, the immersion time in the treating solution A is usually 1 to 60 minutes.

The thickness of the plated film is preferably 1 to 5 μm. But even if the thickness is over 5 μm, there is no obstacle for improving the adhesiveness.

After the treatment of the metal surface with the treating solution A, the treatment with at least one member selected from the group consisting of an ammonia water, an aqueous solution containing a reducing agent and an acid solution (hereinafter referred to as "treating solution B") can give more desirable results.

The treatment with ammonia water can be carried out by selecting the concentration, the treating temperature and the treating time properly so as to remove impurities such as cuprous oxide coprecipitated on the metallic copper layer obtained by the treatment with the treating solution A.

The aqueous solution containing a reducing agent can be prepared by using formaldehyde, paraformaldehyde, hypophosphorous acid or a salt thereof, etc. as a reducing agent. In the case of using formaldehyde or paraformaldehyde, it is preferable to make the aqueous solution alkaline in the pH range of 9.0 to 13.5 in order to provide reducing properties. It is possible to add a complexing agent for copper ions to the reducing aqueous solution. It is also possible to use an electroless copper deposition solution containing a copper salt, hydroxyl ions, an complexing agent for copper ions, and formaldehyde but hardly proceed the electroless copper deposition reaction due to the too low concentration of copper salts. Even in these cases, the concentration of reducing agent and the like, the temperature of the solution B and the treating time can be selected properly so as to make the adhesive strength between the treated surface and the resin maximum so long as the glossless and dark colored surface obtained by the treatment with the treating solution A is retained.

In the case of acid solution, there can be used an aqueous solution of hydrochloric acid, sulfuric acid, ammonium persulfate, etc. The concentration, the temperature and the treating time of the acid solution can be selected properly so as to make the adhesive strength between the treated surface and the resin maximum so long as the glossless and dark colored surface obtained by the treatment with the treating solution A is retained.

When the treatment wih the treating solution B is conducted after the treatment with a sodium chloritesodium hydroxide-trisodium phosphate solution employed in the prior art process (3) mentioned above, the adhesive strength between the treated surface and the resin is remarkably lowered compared with the prior art process. In contrast, according to this invention, since the treatment with the treating solution B is conducted after the treatment with the treating solution A, the adhesive strength between the treated surface and the resin can be improved compared with the case of only the treatment with the treating solution A.

The treatment with the treating solution A or B can be conducted by a conventional process such as dipping, spraying, etc.

The conductors to be treated by this invention can be conductors obtained by either etching copper foil of copper clad laminates, electroless copper plating, or a combination of electroless and electro-plating of copper.

Before the surface treatment of metal according to this invention, the surface of metal such as wiring patterns on inner layer laminates can be pre-treated with an aqueous solution of at least one compound selected from the group consisting of hydrochloric acid, sulfuric acid, nitric acid, phosphoric acid, acetic acid, copper compounds such as cupric chloride, copper sulfate, etc., iron compounds such as ferric chloride, ferric sulfate, alkali metal chlorides, ammonium persulfate, and the like for the purpose of "roughening" of the surface. It is also possible to employ mechanical methods such as liquid honing, abration, etc., in place of the chemical "roughening" method.

Further the conductors metal to be surface treated can be metals other than copper, for example, stainless steel, nickel, iron, aluminum, etc. In the case of these metals other than copper, a conventional catalyst for electroless plating can be provided as a pre-treatment befofe the treatment according to this invention in order to make the treating reaction uniform.

This invention was explained as to the treatment of conductors of wiring pattern on inner layer printed wiring boards, but the treating solution A or A and B used in this invention can also be used for a surface treatment of copper of copper clad laminates for increasing the adhesive strength between the copper and the resist which is formed on the copper or surface. It can also be used for a surface treatment of copper conductors for increasing the adhesive strength between the copper conductor surface and the solder resist. That is, when the treatment according to this invention is conducted after the formation of copper conductors by an etching method or an additive method, and an insulating resin, e.g. a resist ink, an adhesive, or the like is coated or adhered by a screen printing method, a curtain coating method or a hot roll laminating method followed by formation of copper conductors, the adhesive strength between the copper conductor surface and the above-mentioned material can be improved remarkably. Thus, a multilayer printed wiring board can be produced without using a pressing step, when conductors are formed on the outer layers of above-mentioned material according to a conventional method.

This invention can also be applied to the treatment of a surface of copper foil to be contacted with a prepreg in the production of copper clad laminates by bonding with lamination of the copper foil and the prepreg, and the treatment of a surface of copper foil to be contacted with a flexible film in the production of substrates for flexible wiring boards by bonding the copper foil and the flexible film. The above-mentioned treatments can be applied to not only the surface of copper but also the surfaces of stainless steel, nickel, iron, aluminum, and the like.

As mentioned above, according to this invention, the adhesive strength between a resin material such as prepreg and a metal such as copper is improved, the line definition of inner layer conductors is excellent in multilayer printed wiring boards, and thus there can be obtained printed wiring boards fot inner layers excellent in the adhesive strength and shelf life.

This invention is illustrated by way of the following Examples and Comparative Examples, in which all percents are by weight unless otherwise specified.

EXAMPLE 1

A copper clad laminate wherein an epoxy resin was used was subjected to a roughening treatment previously with ammonium persulfate aqueous solution. Then, it was immersed in a treating solution obtained by adding 3 mg/liter of 4,7-dimethyl-1,10-phenanthroline to a fundamental bath composition ($A_1$) at 70°±2° C. for 10 minutes.

Fundamental bath composition ($A_1$):

| | |
|---|---|
| $CuSO_4.5H_2O$ | 10 g/liter |
| EDTA.2Na | 40 g/liter |
| 37% HCHO | 5 ml/liter |
| pH (room temp) | 12.0 |
| Deionized water | an amount making the total volume 1 liter |

The color of treated copper surface, and the results of a tape test and a test for shelf life were listed in Table 1.

The tape test was carried out for examining the adhesive strength of the treated surface. A pressure-sensitive adhesive tape with 10 mm wide and an adhesive on one side (manufactured by Nitto Electric Industrial Co., Ltd.) was attached to the treated surface and stuck tightly until the tape became transparent. Then, the tape was peeled off gradually and a remaining amount of the adhesive on the treated surface was evaluated. The larger the remaining amount of adhesive, the higher the adhesive strength. The adhesive strength was evaluated as follows: X no adhesive was retained; ∆ the adhesive was retained slightly; o the adhesive was retained on about half of the surface; and ⊚ the adhesive was retained on the whole surface.

The shelf life test was conducted to examine the period of usable time for bonding with lamination without lowering the adhesive strength. After allowed to stand at room temperature with ambient moisture for 7 days, the above-mentioned tape test was conducted on the treated surface and evaluated in the same manner as mentioned above.

EXAMPLE 2

The process of Example 1 was repeated except for using 100 mg/liter of 1,10-phenanthroline in place of 3 mg/liter of 4,7-dimethyl-1,10-phenanthroline and making the immersion time 30 minutes in place of 10 minutes.

The color of treated copper surface and the results of the tape test and the shelf life test were listed in Table 1.

EXAMPLE 3

The process of Example 1 was repeated except for using 10 mg/liter of $\alpha,\alpha'$-dipyridyl in place of 3 mg/liter of 4,7-dimethyl-1,10-phenanthroline.

The color of treated copper surface and the results of the tape test and the shelf life test were listed in Table 1.

EXAMPLE 4

The process of Example 1 was repeated except for using 20 mg/liter of 2,4,6-tris(2-pyridyl)-s-triazine in place of 3 mg/liter of 4,7-dimethyl-1,10-phenanthroline and making the immersion time 5 minutes in place of 10 minutes.

The color of treated copper surface and the results of the tape test and the shelf life test were listed in Table 1.

EXAMPLE 5

The process of Example 1 was repeated except for using 10 mg/liter of 3-(2-pyridyl)-5,6-diphenyl-1,2,4triazine in place of 3 mg/liter of 4,7-dimethyl-1,10phenanthroline and making the immersion time 30 minutes in place of 10 minutes.

The color of treated copper surface and the results of the tape test and the shelf life test were listed in Table 1.

COMPARATIVE EXAMPLE 1

A copper clad laminate wherein an epoxy resin was used was subjected to a roughening treatment previously with ammonium persulfate aqueous solution.

The color of treated copper surface and the results of the tape test and the shelf life test were listed in Table 1.

TABLE 1

| Example No. | Color of treated surface | Tape test | Shelf life |
| --- | --- | --- | --- |
| Example 1 | Bluish violet | ⊙ | ⊙ |
| Example 2 | Bluish violet | ⊙ | ⊙ |
| Example 3 | Bluish black | ⊙ | ⊙ |
| Example 4 | Bluish black | ⊙ | ⊙ |
| Example 5 | Dark brown | ⊙ | ⊙ |
| Comparative Example 1 | Copper color | x | x |

EXAMPLE 6

Inner layer circuits were formed on a copper clad laminate (two-side board) wherein an epoxy resin was used to give a printed circuit board, which was treated as follows.

The printed circuit board was subjected to degreasing, roughening with ammonium persulfate aqueous solution, rinsing with water, immersion in a treating solution obtained by adding 10 mg/liter of 4,7-dimethyl-1,10-phenanthroline to the fundamental bath composition (A₁) used in Example 1 at 70° C. for 10 minutes, rinsing with water, and drying at 100° C. for 30 minutes. The resulting printed circuit board was subjected to pressing with heating with prepregs 3 and copper foils 4 as shown in the attached drawing (pressure 60 kg/cm², temperature 170° C., time 120 minutes) to give a multilayer printed circuit board. In the attached drawing, numeral 1 denotes an inner layer circuit substrate and numeral 2 a circuit copper foil formed on the inner layer circuit substrate.

Properties of the resulting multilayer printed circuit board were shown in Table 2.

COMPARATIVE EXAMPLE 2

Inner layer circuits were formed on a copper clad laminate (two-side board) wherein an epoxy resin was used to give a printed circuit board, which was treated as follows.

The printed circuit board was subjected to degreasing, roughening with ammonium persulfate aqueous solution, rinsing with water, and drying at 100° C. for 30 minutes. Using the thus treated printed circuit board, a multilayer printed circuit board was produced in the same manner as described in Example 6.

Properties of the resulting multilayer printed circuit board were shown in Table 2.

COMPARATIVE EXAMPLE 3

Inner layer circuit were formed on a copper clad laminate (two-sided board) wherein an epoxy resin was used to give a printed circuit board, which was treated as follows.

The printed circuit board was subjected to degreasing, roughening, washing with water, immersion in an aqueous solution (sodium hydroxide 0.5%, trisodium phosphate 1% and sodium chlorite 3%) at 70° C. for 1 minute, rinsing with water, and drying at 100° C. for 30 minutes. Using the thus treated printed circuit board, a multilayer printed circuit board was produced in the same manner as described in Example 6.

Properties of the resulting multilayer printed circuit board were shown in Table 2.

COMPARATIVE EXAMPLE 4

Inner layer circuits were formed on a copper clad laminate (two-sided board) having both-side roughed copper foil wherein an epoxy resin was used to give a printed circuit board. Using the printed circuit board, a multilayer printed circuit board was produced in the same manner as described in Example 6.

Properties of the resulting multilayer printed circuit board were shown in Table 2.

TABLE 2

| Example No. | Adhesive*¹ strength (kg/cm) | Line definition*² of inner layer conductors | Shelf life |
| --- | --- | --- | --- |
| Example 6 | 1.0 | Excellent | Adhesiveness was not deteriorated after standing at room temp. and ambient moisture for 7 days. |
| Comparative Example 2 | 0.3 | Excellent | Adhesiveness was low as an initial value after standing at room temp. and |

TABLE 2-continued

| Example No. | Adhesive*1 strength (kg/cm) | Line definition*2 of inner layer conductors | Shelf life |
|---|---|---|---|
| Comparative Example 3 | 1.2 | Excellent | ambient moisture for 7 days. Adhesiveness was deteriorated after standing at room temp. and ambient moisture for 2 days. |
| Comparative Example 4 | 1.0 | Poor | Adhesiveness was not deteriorated after standing at room temp. and ambient moisture for 7 days. |

Note:
*1Values obtained by peeling an inner layer copper foil according to JIS-C6481.
*2Excellent = Linearity at line edge was good. Poor = Line edge lies in a zigzag line.

EXAMPLES 7 to 11

Copper clad laminates for inner layers previously provided with inner layer circuits were subjected to a roughening treatment with ammonium persulfate aqueous solution, followed by a treatment with the following treating solution ($A_2$) for 15 minutes under the following conditions:

| | |
|---|---|
| $CuSO_4.5H_2O$ | 5 g/liter |
| $EDTA.2Na$ | 20 g/liter |
| 37% HCHO | 4.0 ml/liter |
| 4,7-Dimethyl-1,10-phenanthroline | 5 mg/liter |
| pH (room temp) | 12.3 |
| Deionized water | an amount making the total volume 1 liter |
| Bath temperature | 70 ± 2° C. |

Subsequently, the treated inner layer copper clad laminates were treated with a treating solution B and treating conditions as listed in Table 3.

TABLE 3

| Example No. | Treating solution B | Temperature of treating soln. B (°C.) | Treating time |
|---|---|---|---|
| 7 | 1% HCl aqueous solution | 20–25 | 30 sec |
| 8 | 5% ammonium persulfate | 20–25 | 1 min |
| 9 | 5% ammonia water | 20–25 | 10 min |
| 10 | 37% HCHO (4 ml/liter) pH = 12.3 Deionized water: an amount making the total volume 1 liter | 70 ± 2 | 30 min |
| 11 | 37% HCHO (4 ml/liter) pH = 12.0 EDTA.2Na (30 g/liter) $CuSO_4.5H_2O$ (0.5 g/liter) Deionized water: an amount making the total volume 1 liter | 70 ± 2 | 30 min |

The resulting inner layer copper clad laminates were subjected to pressing with heating with prepregs 3 and copper foils 4 as shown in the attached drawing (pressure 60 kg/cm², temperature 170° C., time 120 minutes) to give multilayer printed circuit boards.

Properties of the multilayer printed circuit boards were tested and listed in Table 4.

Adhesive strength: JIS-C 6481 (see footnote of Table 2).

Resistance to HCl aqueous solution: A sample of 130×30 mm was cut off and surface copper foils thereon were removed. After drilling 36 holes with a diameter of each of 1 mm, the resulting sample was dipped in 18% HCl aqueous solution. The time required for making HCl penetrate into inner layer surfaces was evaluated as follows:
o: no penetration in all 36 holes,
Δ: 1 to 5 holes among 36 holes were penetrated and,
x: 6 or more holes among 36 holes were penetrated.

Resistance to electroless copper deposition bath: A sample of 130×30 mm was cut off and surface copper foils thereon were removed. After drilling 36 holes with a diameter of each 1 mm, the resulting sample was dipped in the following electroless copper deposition bath. The time required for making the electroless copper doposition bath penetrate into inner layer surfaces was evaluated as follows:
o: 36 holes were not penetrated,
Δ: 1 to 5 holes among 36 holes were penetrated, and
x: 6 or more holes among 36 holes were penetrated.

Electroless copper deposition bath:

| | |
|---|---|
| $CuSO_4.5H_2O$ | 10 g/liter |
| $EDTA.4Na$ | 30 g/liter |
| 37% HCHO aq. solution | 4 ml/liter |
| pH (room temp.) | 12.3 |
| Deionized water | an amount making the total volume 1 liter |

COMPARATIVE EXAMPLE 5

A copper clad laminate for inner layers previously provided with inner layer circuits was subjected to a roughening treatment with ammonium persulfate aqueous solution, followed by immersion in an aqueous solution containing 0.5% of NaOH, 1% of trisodium phosphate and 3% of sodium chlorite at 70° C. for 1 minute. The thus treated copper clad laminate was subjected to pressing with heating in the same manner as described in Examples 7–11 to give a multilayer printed circuit board.

Properties of the multilayer printed circuit board were tested and listed in Table 4.

COMPARATIVE EXAMPLE 6

A copper clad laminate for inner layers treated with ammonium persulfate aqueous solution and an aqueous solution containing NaOH, trisodium phosphate and sodium chlorite in the same manner as described in Comparative Example 5 was subjected to the same treatment with the treating solution B as described in Example 7. Then, the thus treated copper clad laminate was subjected to pressing with heating in the same manner as described in Examples 7–11 to give a multilayer printed circuit board.

Properties of the multilayer printed circuit board were tested and listed in Table 4.

REFERENTIAL EXAMPLE 1

The process of Examples 7-11 was repeated except that the treatment with a treating solution B was omitted. A multilayer printed circuit board was prepared in the same manner as described in Examples 7-11.

Properties of the multilayer printed circuit board were tested and listed in Table 4.

TABLE 4

| Example No. | Adhesive strength (kgf/cm) | Resistance to HCl (min) | | | | | | Resistance to electroless copper deposition bath (min) | | | | | |
|---|---|---|---|---|---|---|---|---|---|---|---|---|---|
| | | 20 | 30 | 40 | 50 | 60 | 90 | 20 | 30 | 40 | 50 | 60 | 90 |
| Example 7 | 1.04 | o | o | o | o | o | o | o | o | o | o | o | o |
| Example 8 | 1.06 | o | o | o | o | o | o | o | o | o | o | o | o |
| Example 9 | 1.05 | o | o | o | o | o | Δ | o | o | o | o | o | o |
| Example 10 | 1.07 | o | o | o | o | o | Δ | o | o | o | o | o | o |
| Example 11 | 1.06 | o | o | o | o | o | Δ | o | o | o | o | o | o |
| Comparative Example 5 | 1.06 | x | x | x | x | x | x | Δ | x | x | x | x | x |
| Comparative Example 6 | 0.32 | o | o | o | o | o | o | o | o | o | o | o | o |
| Referential Example 1 | 1.00 | o | Δ | x | x | x | x | o | Δ | x | x | x | x |

As shown in Table 4, Examples 7-11 are remarkably improved in the adhesive strength, the resistance to HCl aqueous solution, and the resistance to electroless copper deposition bath compared with Referential Example 1 wherein no treatment with the treating solution B is conducted.

In Comparative Example 6, the resistance to HCl aqueous solution and the resistance to electroless copper deposition bath are good, but there takes place badness in peeling at the adhered surface depending on soldering temperature when parts are mounted on the multilayer printed circuit board with solder due to low inner layer peeling strength.

EXAMPLE 12

Copper clad laminates wherein an epoxy resin was used were subjected to a roughening treatment with ammonium persulfate aqueous solution, followed by immersion in a treating solution obtained by adding 10 mg/liter of benzoguanamine, 8-azaguanine, xanthopterin, 2-aminoperimidine.hydrochloride, 2-aminopyrimidine, 6-hydroxy-2,4,5-triaminopyrimidine.sulfate or nitroguanidine to a fundamental bath composition $(A_3)$ at $70 \pm 2°$ C. for 5 minutes.

Fundamental bath composition $(A_3)$:

| | |
|---|---|
| $CuSO_4.5H_2O$ | 10 g/liter |
| EDTA.2Na | 40 g/liter |
| pH (room temp.) with NaOH | 12.5 |
| 37% HCHO | 4 ml/liter |
| Deionized water | an amount for making the total volume 1 liter |

The color of treated copper surface was observed and the tape test and the shelf life test were carried out as described in Example 1.

The results were listed in Table 5 together with those of Comparative Example 1.

TABLE 5

| Example No. | Adding compound | Color of treated surface | Tape test | Shelf life |
|---|---|---|---|---|
| Example 12 | | | | |
| Run No. 1 | Benzognanamine | Brown | ◎ | ◎ |
| Run No. 2 | 8-Azaguanine | Brown | ◎ | ◎ |
| Run No. 3 | Xanthopterin | Brown | ◎ | ◎ |
| Run No. 4 | 2-Aminoperimidine.hydrochloride | Brown | ◎ | ◎ |
| Run No. 5 | 2-Aminopyrimidine | Brown | o | o |
| Run No. 6 | 6-Hydroxy-2,4,5-triamino-pyrimidine.sulfate | Brown | o | o |
| Run No. 7 | Nitroguanidine | Brown | ◎ | ◎ |
| Comparative Example 1 | — | Copper color | x | x |

EXAMPLE 13

Inner layer circuits were formed on copper clad laminates (two-sided boards) wherein an epoxy resin was used to give printed wiring boards, which were treated as follows.

The printed wiring boards were subjected to degreasing, roughening with ammonium persulfate aqueous solution, rinsing with water, immersion in a treating solution obtained by adding 15 mg/liter of xanthopterin, 2-aminoperimidine.hydrochloride or nitroguanidine to the fundamental bath composition $(A_3)$ used in Example 12 at 70° C. for 5 minutes, rising with water, and drying at 100° C. for 30 minutes. The resulting printed circuit board was subjected to pressing with heating in the same manner as described in Example 6 to give multilayer printed wiring boards.

Properties of the multilayer printed wiring boards were tested and listed in Table 6.

| | |
|---|---|
| Adhesive strength: | JIS-C6481 (see footnote of Table 2) |
| Line definition of inner layer conductors: | See footnote of Table 2. |
| Shelf life: | See Example 1. |
| Resistance to HCl aqueous solution: | See Examples 7 to 11. |

EXAMPLE 14

The process of Example 13 was repeated except that a treatment with a treating solution B (1% HCl aqueous solution) at 20°-25° C. for 30 seconds was inserted after the treatment with the modified fundamental bath composition $(A_3)$.

Properties of the produced multilayer printed wiring boards were tested and listed in Table 6.

TABLE 6

| Example No. | Adding compound | Adhesive strength (kg/cm) | Line definition of inner layer conductors | Shelf life | Resistance to HCl (min) 20 | 30 | 60 | 120 | 180 |
| --- | --- | --- | --- | --- | --- | --- | --- | --- | --- |
| Example 13 | Xanthopterin | 1.3 | Excellent | Adhesiveness was not deteriorated after standing at room temp. and ambient moisture for 7 days | o | o | o | o | o |
| | 2-Aminoperimidine.hydrochloride | 1.2 | Excellent | | o | o | o | o | o |
| | Nitroguanidine | 1.2 | Excellent | | o | o | o | o | o |
| Example 14 | Xanthopterin | 1.5 | Excellent | Adhesiveness was not deteriorated after standing at room temp. and ambient moisture for 7 days | o | o | o | o | o |
| | 2-Aminoperimidine.hydrochloride | 1.4 | Excellent | | o | o | o | o | o |
| | Nitroguanidine | 1.3 | Excellent | | o | o | o | o | o |
| Comparative Example 2 | — | 0.3 | Excellent | Adhesiveness was low as an initial value after standing at room temp. and ambient moisture for 7 days. | x | x | x | x | x |
| Comparative Example 3 | — | 1.2 | Excellent | Adhesiveness was deteriorated after standing at room temp. and ambient moisture for 2 days. | x | x | x | x | x |
| Comparative Example 4 | — | 1.0 | Poor | Adhesiveness was not deteriorated after standing at room temp. and ambient moisture for 7 days. | o | o | o | o | o |

What is claimed is:

1. A process for treating a surface of a metal which comprises:

treating a metal surface with a liquid composition comprising (I) copper ions, a complexing agent for copper ions, a reducing agent for copper ions, a pH adjusting agent, water and (II) at least one nitrogen-containing organic compound selected from the group consisting of 2,4,6-tris(2-pyridyl)-s-triazine, α,α',α''-tripyridyl, 1,10-phenanthroline, 4,7-diphenyl-1, 10-phenanthroline, 4,7-dimethyl-1,10-phenanthroline, 4,7-diphenyl-1,10-phenanthroline disulfonic acid disodium salt, 3-(2-pyridyl)-5,6-diphenyl-1,2,4-triazine, α,α'-dipyridyl, Phthalocyanine Green, 8-azaguanine, xanthopterin, 5-aminoindazole, 2-aminoperimidine.hydrochloride, 2-amino-perimidine.hydrobromide, benzoguanamine, acriflavine.hydrochloride, 5-amino-1H-tetrazole, 6-amino-2-phenyl-4-quinolinol, 2-amino-6,8-dihydroxypurine, 2-aminopyrimidine, 6-hydroxy-2,4,5-triaminopyrimidine.sulfate, 2,4-diamino-6-hydroxypyrimidine, 2-amino-4-hydroxy-6-methylpyrimidine, 4,6-dihydroxypyrimidine, nitroguanidine, 1-hydroxy-1H-benzotriazole.monohydrate, 2-hydroxybenzimidazole and 2-amino-3-hydroxypyridine, forming an electroless copper deposition layer having an average absorption rate of 0.5 or more, and bonding a resin to the electroless copper deposition layer.

2. A process according to claim 1, wherein the electroless copper deposition layer has an average absorption rate of 0.7 or more.

3. A process according to claim 1, wherein the nitrogen-containing organic compound is at least one member selected from the group consisting of xanthopterin, 2-aminoperimidine.hydrochloride, 2-aminoperimidine.hydrobromide, 6-hydroxy-2,4,5-triaminopyrimidine.sulfate, 2,4-diamino-6-hydroxypyrimiidine, and nitroguanidine.

4. A process according to claim 1, wherein the metal surface is formed by a film of copper.

5. A process according to claim 1, wherein the metal surface is formed by a film of stainless steel, nickel, iron or aluminum.

6. A process according to claim 1, wherein the amount of the nitrogen-containing organic compound is in the range of 1 to 500 mg/liter.

7. A process accordin- to claim 1, wherein the nitrogen-containing heterocyclic compound is at least one member selected from the group consisting of 2,4,6-tris(2-pyridyl)-s-triazine, α,α',α''-tripyridyl, 1,10-penanthroline, 4,7-diphenyl-1,10-phenanthroline, 4,7-dimethyl-1,10-phenanthroline, 4,7-diphenyl-1,10-phenanthroline disulfonic acid disodium salt, 3-(2-pyridyl)-5,6-diphenyl-1,2,4-triazone, α,α'-dipyridyl, Phthalocyanine Green and 2,4-dimethylimidazoline.

8. A process according to claim 1, wherein the organic compound is at least one member selected from the group consisting of 8-azaguanine, xanthopterin, 5-aminoindzole, 2-aminoperimidine.hydrochloride, 2-aminoperimidine.hydrobromide, benzoguanamine, acriflavine. hydrochloride, 5-amino-1H-tetrazole, 6-amino-2-phenyl-4-quinolinol, 2-amino-6,8-dihydroxypurine, 2-aminopyrimidine, 6-hydroxy-2,4,5-triaminopyrimidine.sulfate, 2,4-diamino-6-hydroxypyrimidine, 2-amino-4-hydroxy-6-methylpyrimidine, 4,6-dihydroxypyrimidine, nitroguanidine, 1-hydroxy-1H-benzotriazole.monohydrate, 2-hydroxybenzimidazole and 2-amino-3-hydroxypyridine.

9. A process according to claim 1, which further comprises treating the electroless copper deposition layer with at least one member selected from the group consisting of ammonia water, an aqueous solution containing a reducing agent and an acid solution prior to bonding a resin to said layer.

10. A process according to claim 1, which further comprises bonding more resin layers to the electroless copper deposition layer to give a laminate of at least one metal layer and at least two resin layers.

* * * * *